United States Patent [19]

Dinkel

[11] 4,215,268
[45] Jul. 29, 1980

[54] CIRCUITS PRIMARILY INTENDED FOR USE IN DESOLDERING TOOLS

[75] Inventor: Ernst J. Dinkel, Cerritos, Calif.

[73] Assignee: Eldon Industries, Inc., Hawthorne, Calif.

[21] Appl. No.: 892,428

[22] Filed: Mar. 31, 1978

[51] Int. Cl.² .......................... H03R 17/00; H01B 1/02
[52] U.S. Cl. ................................ 219/507; 323/22 SC; 219/501; 219/486; 219/492
[58] Field of Search ............... 219/483, 485, 486, 489, 219/501, 494, 492, 507, 508, 509, 230, 241; 323/22 SC; 307/39–41, 252 UA; 228/19, 20

[56] References Cited

U.S. PATENT DOCUMENTS

| | | | |
|---|---|---|---|
| 3,247,358 | 4/1966 | Schmidt | 219/509 |
| 3,314,574 | 4/1967 | Longval et al. | 222/146 |
| 3,456,095 | 7/1969 | Fox | 219/501 |
| 3,551,639 | 12/1970 | Gotley | 219/241 |
| 3,649,849 | 3/1972 | McGuirk, Jr. | 323/22 SC |
| 3,708,696 | 1/1973 | Lorenz | 219/501 |
| 3,716,692 | 2/1973 | Schick et al. | 219/501 |
| 3,862,468 | 1/1975 | Fortune | 228/20 |
| 3,883,716 | 5/1975 | Fortune | 219/241 |
| 4,031,458 | 6/1977 | Ichikawa | 323/22 SC |

OTHER PUBLICATIONS

"SCR Specifications", by Weller Company, p. 1, (no date).

Primary Examiner—Gerald P. Tolin
Assistant Examiner—M. Paschall
Attorney, Agent, or Firm—Edward D. O'Brian

[57] ABSTRACT

Two different types of circuits, the first a coil operation circuit and the second an operating circuit can be effectively used together in connection with an assembly such as a desoldering tool having a remotely located, associated structure for use in regulating when a vacuum is available at the tool in response to manipulation of the tool. The operating circuit employed utilizes a current control circuit capable of being actuated through the use of a switch on the tool to pass a full or a half wave AC current and a load such as a heating element located on the tool. The operating circuit also includes a detection circuit for determining whether a full or half wave current is being utilized to supply power to the load which is positioned within the associated structure. The coil operation circuit is located within this associated structure and includes a bidirectional solid state switch is series with a coil, another solid state switch in parallel with the coil, and the first noted switch. The two switches are connected through the use of a network containing a diode and a capacitor so as to control the operation of a first switch. A coupling circuit connects the detection circuit and the second switch for operating the second switch in accordance with whether a full or half wave current is being utilized to power the load.

7 Claims, 1 Drawing Figure

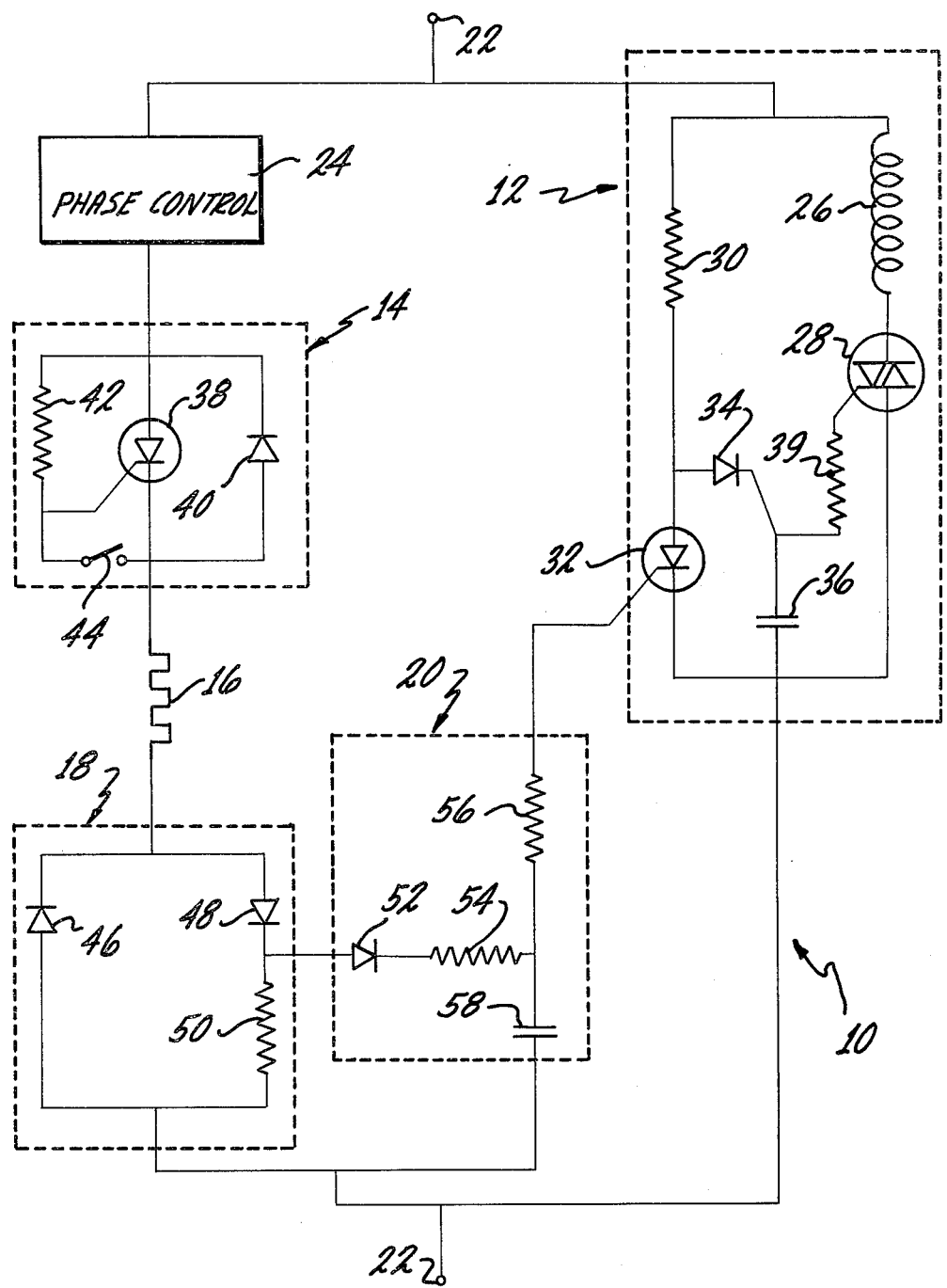

CIRCUITS PRIMARILY INTENDED FOR USE IN DESOLDERING TOOLS

BACKGROUND OF THE INVENTION

The invention set forth in this specification is directed to complete or composite circuits which are primarily intended for use in electrically heated desoldering equipment. The invention, however, is considered to be of broader scope than such utilization. In its broader aspects the invention relates to coil operation circuits such as may be utilized in controlling the operation of a load such as a solenoid or relay coil. It also relates to such coil operation circuits utilized in combination with operating circuits enabling a single switch in a series circuit to be utilized to control whether or not power is supplied to the coil while the series circuit is utilized for its intended purpose of supplying power to a load.

The circuits in accordance with this invention are considered to be particularly desirable for use in electrically heated desoldering equipment constructed so as to include a hand-held manipulative desoldering tool and an associated structure utilized to supply a vacuum to the desoldering tool and utilized to regulate the amount of heat given off by a heating element in such a tool. Such tools are commonly constructed so that a tube capable of being used in conjunction with a vacuum to "suck up" solder is located within the tool so as to extend through the center of the heating element. In order to facilitate the use of such a tool an appropriate control is normally employed so as to regulate when a vacuum is supplied to such a tube. Such a control is desired so that the vacuum will be used only when solder to be removed has been melted through the use of the heating element.

Several problems have been encountered in incorporating a control for the application of a vacuum to a manipulative desoldering tool as indicated in the preceding discussion. In order to minimize the size of the tool so as to facilitate the ease with which the tool may be used it is desired to minimize the number of components within the tool to the greatest possible extent. Further, it is normally desired to utilize as few electrical conductors or tubes leading to the tool as reasonably possible. These considerations are considered to make the prior utilizations of vacuum control valves within such tools and the prior utilization of control wires for separately controlling the application of a vacuum in desoldering tools comparatively undesirable. It is not considered that an understanding of the present invention requires a detailed explanation of such prior structures utilizing mechanical vacuum control valves in a tool and/or a detailed discussion of the disadvantages of using conventional switches to remotely control a vacuum in a tool as noted.

SUMMARY OF THE INVENTION

An objective of the present invention is to provide new and improved electrically operated desoldering equipment through the utilization of complete or composite circuits as herein described. A further objective of the invention is to provide circuits as herein indicated which enable a desoldering tool to be constructed so that a single switch in the circuit utilized to power the heating element in the tool may be utilized to remotely control when a vacuum is applied to the desoldering tool itself. Through the utilization of such a single switch the invention makes it possible to only utilize a normal series circuit to supply electric power to the heater in such a tool and avoids the necessity for utilizing separate electric conductors extending to the tool to remotely control the application of a vacuum to the tool. Further, the invention avoids any necessity for utilizing a vacuum control valve in the tool itself.

It is not to be assumed that the invention is limited to the utilization of circuits as herein explained in connection with desoldering tools. The invention is also concerned with new and improved load operation circuits which can be utilized so as to control the flow of an AC current through a load such as a solenoid or relay coil. The invention is also capable of being employed in connection with the remote operation of such a load operation circuit through the utilization of an operating circuit employed for a conventional purpose.

In accordance with this invention the broad objectives of the invention indicated in the preceding discussion are achieved by providing in a load operation circuit having a load connected in series with a switch means for controlling current flow through the load across AC current terminals, the improvement which comprises: the switch means comprising a bidirectional solid state switch responsive to an applied electric signal to pass a current, another solid state switch located in parallel with the load and the bidirectional solid state switch, the other switch being capable of passing a current in one direction in response to an applied signal, a diode and a capacitor connected in series with one another in a network connected in parallel around the other switch, the diode passing current in the same direction as the other switch, and an electrical connection between said diode and capacitor with the bidirectional switch for supplying a signal to the bidirectional switch so as to control the operation of the bidirectional switch.

BRIEF DESCRIPTION OF THE DRAWING

The invention is best more fully explained with reference to the accompanying drawing in which:

The FIGURE shows a presently preferred embodiment or form of a complete or composite circuit in accordance with this invention.

The circuit illustrated in the drawing embodies or utilizes the concepts or principles of the invention set forth in the appended claims. These concepts or principles can easily be utilized in a number of different ways and in circuits which differ somewhat from one another as to precise details through the utilization or exercise or routine skill in the electronics field.

DETAILED DESCRIPTION

In the accompanying drawing there is shown a complete circuit 10 in accordance with this invention which as a practical matter can be considered as including a coil operation circuit as indicated by the coil or load operation circuit 12 as illustrated within a dotted area. This complete circuit 10 can also be considered as including an operating circuit (not separately identified) which includes: a current control means or circuit 14 for passing either a full wave or half wave AC current as indicated by another dotted area; a load 16 which in the circuit 10 takes the form of a conventional resistance heating element or heater; and a detection circuit or circuit means 18 as indicated by a further dotted area for determining whether or not a full or a half wave AC current is passing through the heater 16.

This detection circuit 18 is utilized in connection with a coupling circuit or circuit means 20 as illustrated within a still further dotted area which is connected to the detection circuit 18 and to the coil operation circuit 12 as hereinafter indicated. As will be apparent from the drawing the current control circuit 14, the load 16, and the detection circuit 18 are connected in series with one another across AC terminals 22 in parallel with the coil operation circuit 12. If desired a conventional phase control circuit 24 may be located in series with the current control circuit 14, the load 16 and the detection circuit 18 for the purpose of regulating the operation of the heater 16 in a conventional manner.

In the coil operation circuit 12 a conventional coil 26 such as a solenoid coil or a relay coil serving as a load is connected in series with a bidirectional triode thyristor or triac 28 and these components are connected in parallel with a network (not separately numbered) including a limiting resistor 30 and an SCR 32 serving as a solid state switch. A diode 34 and a capacitor 36 are connected in a network (not separately numbered) around the SCR 32. A limiting resistor 39 is employed so as to connect the gate of the triac 28 to a point (not separately numbered) between the diode 34 and the capacitor 36.

The current control circuit 14 employed utilizes an SCR 38 and a diode 40 in parallel with one another. It also utilizes a limiting resistor 42 which is connected between the gate of SCR 38 and the side of the SCR 38 remote from the gate of this SCR 38. This resistor 42 enables a signal to be applied to the SCR 38 so as to normally render this SCR 38 conductive. When the SCR 38 is conductive a full wave AC current can be passed by the current control circuit 14. This current control circuit 14 also includes a small manual switch 44 connected between the gate of the SCR 38 and the adjacent cathode of this SCR 38. This switch 44 is normally open. When it is closed the gate of the SCR 38 is shorted out and the SCR 38 is rendered nonconductive so that the current control circuit 14 will only pass a half wave AC current.

The detection circuit 18 is utilized so as to determine whether a full or a half wave AC current is passed through the heater 16. This detection circuit 18 includes two parallel legs (not separately numbered), one of which contains a diode 46 and the other of which contains another diode 48 and a voltage dropping resistor 50. It will be recognized from a cursory inspection of the drawing that this detection circuit 18 is capable of passing either a full or a half wave AC current with one leg of the detection circuit 18 passing a half wave current in one direction, and the other leg in the other direction.

This detection circuit 18 is employed with the coupling circuit 20 for the purpose of supplying a signal to the SCR 32 in order to render this SCR 32 conductive. The coupling circuit 20 is a rather simple circuit including a diode 52, two limiting resistors 54 and 56, and a capacitor 58. The diode 52 is connected to the connection (not separately numbered) between the diode 48 and the resistor 50 through the resistors 54 and 56 to the gate of the SCR 32. The capacitor 58 is connected from between the resistors 54 and 56 to the lowermost of the terminals 22 as illustrated.

It is believed that those skilled in the art of electronics will have no difficulty in understanding the operation of the complete circuit 10. When an AC current is applied across the terminals 22 and when the switch 44 is open a complete full wave current having a wave form as determined by the phase control 24 is passed through the current control circuit 14, the heater 16 and the detection circuit 18. Such a full wave current is passed because of the diodes 40, 46 and 48 and because the SCR 38 is rendered conductive by a signal applied through the resistor 42.

As such a full wave current passes a half wave current will pass through the diode 52 so as to charge the capacitor 58 at a rate set by the resistor 54. As this capacitor 58 becomes charged a signal will be supplied from it through the resistor 56 to the gate of the SCR 32. For a time increment prior to this signal reaching the gate of the SCR 32 a part of the current applied across the SCR 32 will pass through the diode 34 so as to charge the capacitor 36. As this capacitor 36 becomes charged a signal will be applied to the gate of the triac 28 at a rate depending upon the value of the resistor 30. This will render the triac 28 conductive so that a current can pass the coil 26.

However, the length of time that the current passes the coil 26 at this point is quite limited since a signal is supplied to the gate of the SCR shortly after the triac 28 has been made conductive. When the signal is applied to the gate of the SCR 32 this will, of course, render the SCR 32 conductive so that there will no longer be a voltage potential across it. As this occurs the capacitor 36 will discharge through the gate of the triac 28 so as to no longer supply a signal to the triac 28 holding it conductive. If for any reason difficulty is encountered with the capacitor 36 discharging in this manner a resistor (not shown) may be located in parallel with the capacitor 36 so as to facilitate its discharge.

When the switch 44 is closed the gate of the SCR 38 is shorted out. As a consequence of this only a half wave current will flow through the current control circuit 14, the heater 16, and the detection circuit 18. Because of the action of the resistor 50 this will result in the current passing the diode 52 not being sustained at its former level. Because of the fact that the charge on the capacitor 58 is discharged at the gate of the SCR 32 this capacitor 58 will gradually discharge to the point where the SCR 32 is rendered nonconductive.

When this occurs the current will pass the diode 34 so as to charge the capacitor 36. As this capacitor 36 becomes charged a signal will be applied through the resistor 39 to the gate of the triac 28. At such time the triac 28 becomes conductive so that a current will flow through the coil 26. Such a current will continue to flow until such time as the switch 44 is opened. When this occurs a full wave current will again flow through the heater 16 and a current will flow through the diode 52 so as to charge the capacitor 58. This will again supply a gate current through the resistor 56 which will render the SCR 32 conductive and this will cause the triac 28 to go nonconductive as described in the preceding until such time as the switch 44 is again opened.

In the commercial utilization of the complete circuit 10 which is considered preferable the current control circuit 14 and the heater 16 are located in a desoldering tool (not shown) while the other components described are located at a remote location from such a tool. At such a remote location the coil 26 is preferably used in connection with a conventional solenoid structure so that when the current flows through this coil 26 a valve controlling a vacuum is opened so as to apply suction for the removal of solder in a tube (not shown) extending to and through the tool. Such a tube preferably extends through the center of the heater 16.

As will be apparent from a consideration of the preceding when the switch 44 is closed so as to cause a current to flow through the coil 26 this reduces the power supplied to the heater 16. This causes some decrease in the temperature of the heater 16 for the period that the switch 44 is closed. Since the switch 44 is only closed in the application noted for a comparatively short time normally the fact that the heater 16 does not produce as much heat when the switch 44 is closed as when it is open is comparatively immaterial, particularly in view of the time it takes for heat to be transferred in a normal desoldering tool from the heater 16.

The decreased heat production at the heater 16 when the switch 44 is closed may be desirable in a desoldering tool because of the fact that it is frequently desired to cool solder adjacent to where solder has been removed as rapidly as possible after such solder has been removed. The movement of air as a result of a vacuum being applied through a tube associated with the heater 16 can be considered desirable in accomplishing such cooling.

I claim:

1. In a load operation circuit having a load connected in series with a switch means for controlling current flow through said load across AC current terminals the improvement which comprises:

said switch means comprising a bidirectional solid state switch responsive to an applied electric signal to pass a current, another solid state switch located in parallel with said load and said bidirectional solid state switch, said other switch being capable of passing a current in one direction in response to an applied signal, a diode and a capacitor connected in series with one another in a network connected in parallel around said other switch, a connection between said diode and said capacitor with said bidirectional switch for supplying a signal to said bidirectional switch so as to control the operation of said bidirectional switch, an operating circuit connected in parallel with said coil operation circuit, said operating circuit including in series a current control means for passing either a full wave or a half wave AC current, another load and a detection circuit means for detecting whether a full or a half wave AC current is passing through said load, coupling circuit means for supplying a signal to said other switch when a full wave AC current is passing in said operating circuit so as to actuate said other switch so that it is capable of passing a current, said coupling circuit means connecting said detection means and said other switch.

2. A circuit as claimed in claim 1 including:

phase control means connected in series in said operating circuit for controlling the wave form of the AC current in said operating circuit so as to control the current supplied to said other load.

3. A circuit as claimed in claim 1 wherein:

said current control means includes a diode and an SCR located in parallel to one another, a resistor connecting the gate of said SCR with the side of said SCR remote from said gate and a switch for shorting out said gate of said SCR to the side of said SCR adjacent to said gate.

4. A circuit as claimed in claim 1 wherein:

said other load is a resistance heating element.

5. A circuit as claimed in claim 1 wherein:

said detection circuit consists of two parallel branches within said operating circuit, a diode located within each of said branches, said diodes being located so that one of said diodes will pass a current in one direction in said operating circuit and so that the other of said diodes will pass a current in the other direction in said operating circuit, said coupling circuit means being connected to one of said branches at the cathode side of the diode located in that branch.

6. A circuit as claimed in claim 1 wherein:

said coupling circuit includes a diode connected between said detection circuit means and said other solid state switch, and a capacitor connected to the connections between said diode and said other switch and said operating circuit.

7. A circuit as claimed in claim 1 including:

said operating circuit including a resistance heating element as said other load and phase control means for controlling the wave form of the AC current in said operating circuit, said current control means including a diode and an SCR located in parallel with one another, a resistor connecting the gate of said SCR with the side of said SCR remote from said gate and a switch for shorting out said gate of said SCR to the side of said SCR adjacent to said gate, said detection circuit consisting of two parallel branches within said operating circuit, a diode located so that one of said diodes will pass a current in one direction in said operating circuit and so that the other of said diodes will pass a current in the other direction of said operating circuit, said coupling circuit means includes a diode connecting one of said branches of said detection circuit with said other switch, said diode connecting said branch and said diode within said branch being connected both passing current in the same direction, and a capacitor connected to the connection between said diode and said other switch and connected to said operating circuit.

* * * * *